COMBINATION VHF/UHF TELEVISION TUNER

Filed Oct. 23, 1967 6 Sheets-Sheet 1

INVENTOR.
HOWARD ATKINSON

BY

OSTROLENK, FABER, GERB & SOFFEN

ATTORNEYS

COMBINATION VHF/UHF TELEVISION TUNER

Filed Oct. 23, 1967 6 Sheets-Sheet 2

INVENTOR.
HOWARD ATKINSON

BY

OSTROLENK, FABER, GERB & SOFFEN

ATTORNEYS

Oct. 21, 1969 H. ATKINSON 3,473,392

COMBINATION VHF/UHF TELEVISION TUNER

Filed Oct. 23, 1967 6 Sheets-Sheet 3

INVENTOR.
HOWARD ATKINSON

BY

Ostrolenk, Faber, Gerb & Soffen

ATTORNEYS

INVENTOR.
HOWARD ATKINSON
BY
OSTROLENK, FABER, GERB & SOFFEN
ATTORNEYS

COMBINATION VHF/UHF TELEVISION TUNER

Filed Oct. 23, 1967 6 Sheets-Sheet 5

INVENTOR.
HOWARD ATKINSON

BY

OSTROLENK, FABER, GERB & SOFFEN

ATTORNEYS

INVENTOR.
HOWARD ATKINSON
BY
Ostrolenk, Faber, Gerb & Soffen
ATTORNEYS

United States Patent Office 3,473,392

Patented Oct. 21, 1969

3,473,392

COMBINATION VHF/UHF TELEVISION TUNER

Howard Atkinson, Culver City, Calif., assignor to Standard Kollsman Industries, Inc., Melrose Park, Ill., a corporation of Illinois Filed Oct. 23, 1967, Ser. No. 677,105

Int. Cl. F16h *35/18*

U.S. Cl. 74—10.8 2 Claims

ABSTRACT OF THE DISCLOSURE

A combination VHF/UHF television tuner, in which the VHF and UHF tuning sections are intercoupled to provide complete tuning by means of a pair of concentrically disposed and rotationally activated manual tuning knobs. A first of the manual tuning knobs rotates the VHF tuning section to either the desired VHF channel, or an additional position designated for UHF reception. The second manual input knob provides VHF tuning at any of the VHF positions, and automatically provides UHF tuning when the VHF tuning section is rotated to the UHF position.

My invention relates to an improved tuning arrangement for a combination VHF/UHF television tuner, and more particularly to a novel intercoupling arrangement between the manual input and the dual tuning sections to provide a simplified tuning procedure.

Present television tuners must be capable of receiving television channels within the VHF band of operation (designated channels 2–13 and extending from 54 to 216 megacycles), as well as the UHF band (designated channels 14–83, and extending between 470 and 890 megacycles). Typically, separate tuning sections are provided for receiving the broadcast signals within the respective VHF and UHF bands and converting them to the receiver IF frequency. Some means must therefore be provided for mechanically intercoupling the VHF and UHF tuning sections, so as to conveniently permit the user to selectively receive the desired channel in either the UHF or VHF band. My invention is directed to such an improved intercoupling arrangement, whereby only a single pair of concentrically disposed and rotationally motivated manual knobs are required to achieve the requisite tuning. The intercoupling means is automatically shifted between the VHF and UHF modes of operation, in accordance with the location of the VHF tuning section at the designated UHF position.

Typical present-day VHF tuners, such as the Super-Arbor tuner manufactured by the assignee of the instant invention, include twelve detented and circumferentially disposed VHF tuning positions, corresponding to channels 2–13. At each of these tuning positions, appropriate circuit components are inserted into the television receiver circuitry, such that the desired broadcast channel is heterodyned down to the receive IF frequency. In the "14th position" tuner, an additional detented position is provided, designated the UHF position. When the VHF tuner is rotated to this position, a separate UHF tuner is energized and the input UHF signal band is amplified by the converted VHF tuner, and presented to the UHF tuner. The separate UHF tuner may typically be of the type described in copending U.S. patent application Ser. No. 641,654, filed May 26, 1967, in the name of John J. Frankel and Robert H. Redfield entitled "UHF Television Tuner" and assigned to the assignee of the instant invention.

At the "14th position" the combination tuner is now in the UHF mode of operation and the UHF tuning section must be separately motivated in order to select the desired channel within the UHF broadcast band. Prior to my invention, such means for separately tuning the VHF and UHF sections had included inconvenient arrangements between the respective tuning sections, or imposed upon the user the requirement to shift the manual input between the UHF and VHF sections. As, for example, such prior tuning arrangements have provided, in addition to the VHF channel selection and fine tuning knobs, an additional UHF tuning knob. When the VHF tuning section is rotated to the designated UHF position, it was then necessary for the user to go to a separate UHF knob. In order to avoid the need for such a separate knob, previous attempts have been made to utilize the VHF fine tuning knob for UHF operation, by providing some means for shifting its drive input between the VHF and UHF tuning sections. Typically, this has required the user to press the knob inwardly for shifting, and then rotate the knob for the desired UHF channel selection.

My invention avoids the inconvenient tuning arrangements previously practiced in such combination VHF/UHF tuners, by automatically coupling the VHF fine tuning manual input to the UHF tuner, responsive to the rotation of the VHF tuner to the designated UHF position. Thus, the VHF fine tuning knob is automatically shifted to provide UHF tuning at the "14th position" without requiring any additional manual movements to be initiated by the user, such as the inward pushing of the knob, as had been previously required. Thus, in this "14th position," rotational movement of the VHF fine tuning knob will now automatically provide UHF tuning.

Accordingly, it is a primary object of my invention to provide a simplified tuning arrangement for a combination VHF/UHF television tuner.

A further object of my invention is to provide such a tuning arrangement which provides both coarse tuning and fined tuning for the VHF and UHF sections by means of a pair of concentrically disposed and rotationally motivated manual knobs.

Still another object of my invention is to provide such a combined UHF/VHF television tuner in which the VHF fine tuning knob is automatically intercoupled for UHF tuning responsive to rotation of the VHF tuning section to the designated UHF position.

The combination television tuner constructed in accordance with the above objects includes an automatic shifting mechanism, operatively responsive to the rotational position of the VHF tuning section. The automatic shifting mechanism includes a double faced clutch member, which is keyed to the manual input shaft, and is selectively shifted in driving engagement with either the VHF fine tuning gear means or the UHF tuning gear means. The selective shifting of this double faced gear is provided by a bracket pivotally mounted to the VHF tuner chassis. The bracket includes a cam follower which engages a cam member keyed to the VHF tuning shaft. The cam member includes a lobe portion at the designated UHF (or "14th position), such that the bracket is pivotally moved to disengage the VHF fine tuning gear means and engages the UHF gear train. Conversely, when the VHF tuning section is rotationally moved out of the designated UHF position, the double faced clutch member is longitudinally articulated by the pivoted bracket, so as to become disengaged from the UHF gearing arrangement and to re-engage the VHF fine tuning.

In accordance with a particularly advantageous feature of my invention, the automatic shifting of the double faced clutch member between the VHF fine tuning and UHF gearing means is accomplished without altering the previously tuned adjustment. Hence, both the VHF fine tuning and UHF tuning will be memory preset for subsequent operation.

In accordance with the preferred illustrative embodiment of my invention, an additional shaft is provided coaxial with the shafts carrying the manual tuning knobs. This additional shaft serves to support a rotational display for indicating the UHF channel. This additional coaxial shaft is geared to the UHF input drive shaft, and hence rotates in conjunction therewith. Thus, during the UHF mode of operation, a visual display is provided to the user of the particular channel selected.

It is, therefore, seen that a further object of my invention is to provide a combination UHF-VHF television tuner, which includes an automatic shifting mechanism for inter-connecting a single manual input to either the VHF fine tuning gearing means or the UHF tuning gearing means.

Still another object of my invention is to provide such a combination television tuner, in which the automatic shifting means includes a double faced clutch member keyed to the manual input drive shaft and longitudinally movable in response to the selection of the VHF and UHF modes of operation.

A still further object of my invention is to provide such a combination VHF/UHF television tuning arrangement, in which the longitudinal movement of the double faced clutch member is provided by a pivoted bracket, whose movement is governed by the rotational position of the VHF tuning section.

Still another object of my invention is to provide a combination UHF/VHF tuning arrangement, in accordance with the above-noted object, which further provides a visual display directly coupled to the UHF tuning section for indicating the selected UHF channel.

These as well as other objects of my invention will become readily apparent upon a consideration of the following description and drawings, in which.

Figures 9, 10, 11:
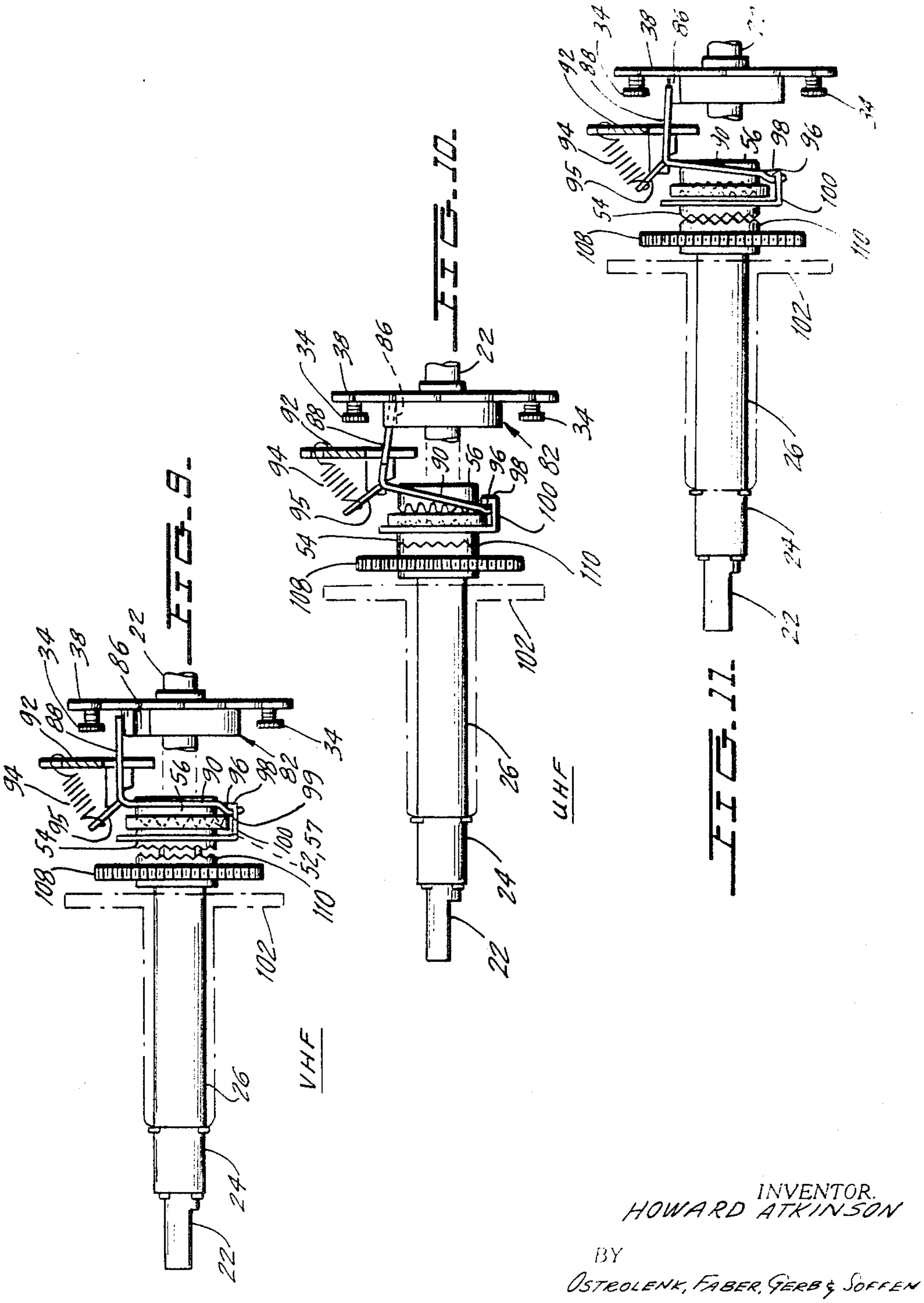
FIG. 9 is a detailed view of the automatic shift mechanism, shown in the condition corresponding to the VHF mode of operation.

FIG. 10 corresponds to FIG. 9, but shows the shifting of the automatic mechanism corresponding to the UHF mode of operation.

FIG. 11 corresponds to FIGS. 9 and 10, but shows the slipping arrangement within the automatic shift mechanism at the UHF mode of operation, which is operative at the arcuate extreme of UHF tuning.

Referring to the figures, the combination VHF/UHF television tuner generally indicated by the number 20 includes a VHF tuning section 30 and a UHF tuning section 45. The VHF tuning section 30 is shown as a conventional type of commercially available turret tuner, such as the super-Arbor tuner, manufactured by the assignee of the instant invention. It should, however, be understood that the instant invention is not limited to such a VHF tuner, and may likewise be practiced in conjunction with other turret or switch-type VHF tuners.

The VHF tuning section includes a rotatable turret 23 mounted within a chassis 21, and having a plurality of circumferentially disposed detended tuning positions. The detent positions are defined by spring bias member 40, which carries a detent ball 42, riding within the indentations 38 of detent wheel 36. The turret tuner includes a pluarlity of circumferentially disposed individual channel tuning strips 31, having a plurality of inductance elements 32 and contact members 33. As the turret is rotated by the VHF input drive shaft 22, the contacts 33 of the individual channel tuning strips are connected to cooperative stationary contacts (not shown) depending from the tuner chassis. At each of the VHF positions, individual preset fine tuning is provided by a longitudinally movable slug member 34, having a gear head which is driven by pinion member 68 in the general manner fully discussed in U.S. Patent No. 3,218,589, to W. D. Delp entitled "Fine Tuning Mechanism for Television Tuners" and assigned to the assignee of the instant invention.

The rotation of the VHF tuning section 30 to the desired VHF channel is provided by virtue of a manually rotatable shaft 22, which receives a first manual tuning knob 150. Manual tuning knob 150 includes a first knurled portion 152, which is grasped by the user and a second skirted portion 154, which provides a visual indication of the selected channel. It is to be noted that in addition to the twelve VHF channels (2–13), there is an additional position designated as UHF. This additional position corresponds to the designated "14th position" of the VHF tuning section, in which the VHF tuner is converted, in the well known manner, to receive the incoming UHF frequencies and amplify them for presentment to the energized UHF tuning section 45.

Concentrically disposed about the manually rotatable input drive shaft 22 is a second manually rotatable input drive shaft 24. At the outwardly extending end thereof, a second manual control knob 160 is provided. Knob 160 includes an outward peripheral portion 162, which is rotated by the user and subsequently intercoupled to provide either VHF fine tuning or UHF tuning, in accordance with the novel concepts of the instant invention. A further shaft 26 is concentrically disposed about shaft 24 and includes a UHF channel indicator 165, which is rotated directly by the UHF tuning section 45 for indicating the particular channel selected during the UHF mode of operation.

Figures 7, 8, 8A:
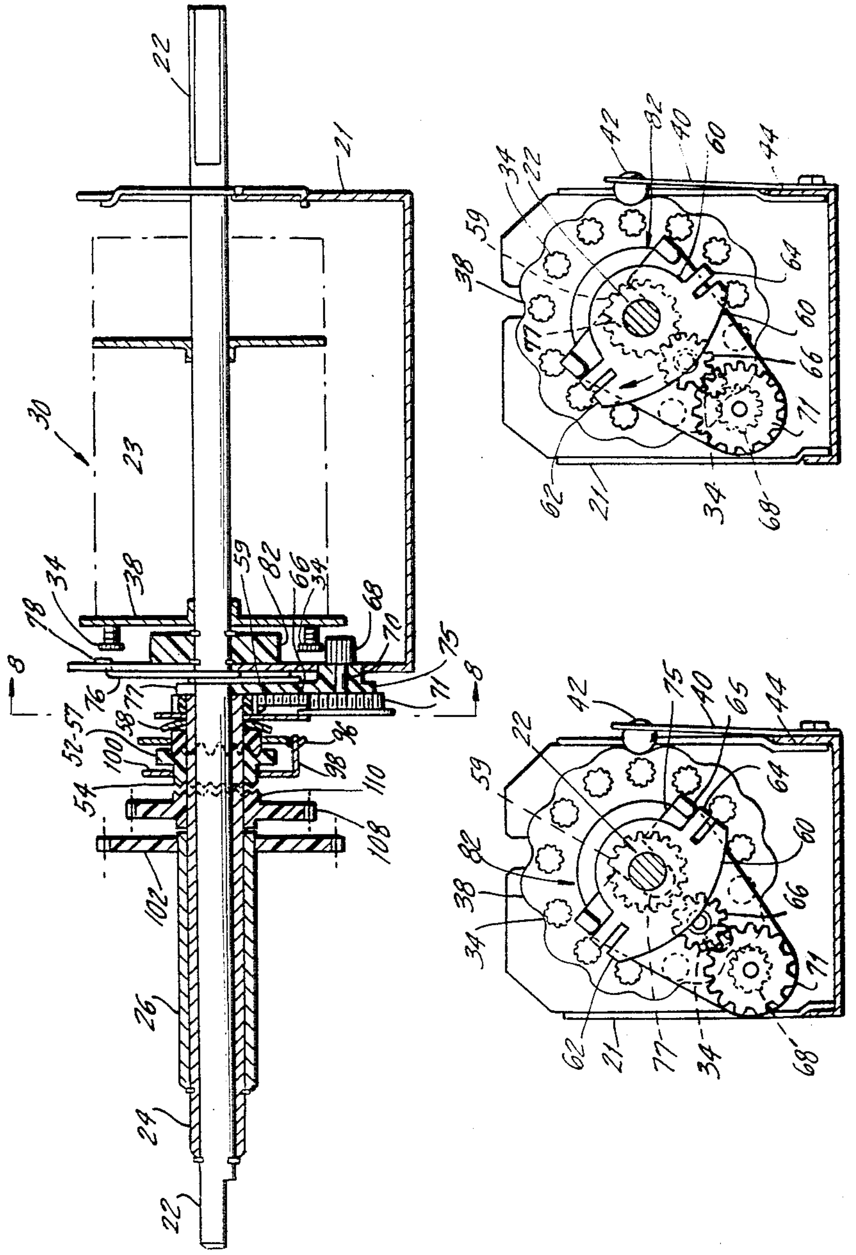
FIG. 7 is a longitudinal cross-sectional view, showing the relationship of the various coaxial shaft and associated gearing members.
FIGS. 8 and 8A are cross-sectional views along the lines 8—8 of FIG. 7, and showing the manner in which VHF preset fine tuning may be provided.

The second manual input drive shaft 24 includes a double faced clutch member 50 keyed thereto by bifurcations 51 and notches 55. Clutch member 50 includes a first set for clutch teeth 52 and a second set of clutch teeth 54 and an annular collar portion **50*c* projecting radially of the sets of clutch teeth 52, 54. In accordance with the instant invention, clutch member 50 is longitudinally movable between the extreme positions shown in FIGS. 9 and 10. In FIG. 9, corresponding to the VHF mode of operation, the clutch member 50 is moved to the right, such that clutch teeth 52 are in engagement with clutch teeth 57 of clutch member 56. Clutch member 56 is in turn directly connected to gear member 59, via the engagement of circumferentially displaced extending ribs 61 and cooperative recesses 63. The rotation of clutch member 56 will, as subsequently be shown, activate the slip clutch mechanism 58, 60, such that the sliding plate 75 is radially moved to a position where the external teeth 65 of gear member 59 are in engagement, with gear 66. (The radial shifting of the gear carrying plate 75 is shown in FIGS. 8 and 8A.) Gear 66, in turn, engages gear 71, which includes pinion member 68, on common shaft 70. During the radially inward displacement of the plate 75, pinion member 68 engages geared 34** of of the particular turning to effect the desired VHF fine tuning.

During the UHF mode of operation, as shown in FIG. 10, the double faced clutch member 50 is displaced to the left, such that its clutch teeth 54 will be in engagement with clutch teeth 110 of the gear member 108. Gear member 108 includes peripherally disposed gear teeth 112, which are in engagement with the gear teeth 116 of a gear member 114, journalled on shaft 122, supported by the mounting bracket 25. Gear member 114 further includes a drive pinion 118, in driving engagement with peripheral teeth 120 of gear member 121, keyed to the UHF input drive shaft 106.

VHF/UHF AUTOMATIC SHIFTING

Hence, it should be understood from the above description that movement of the double faced clutch member 50 to the position shown in FIG. 9 provides VHF preset fine tuning upon a rotational input to the manual control knob 160. Conversely, with the double faced clutch member 50 moved to the left, as shown in FIG. 10, the rotational input to manual knob 160 provides UHF tuning.

The movement of the double faced clutch member 50 between the position shown in FIGS. 9 and 10 is provided by pivoted bracket member 90, which includes outwardly extending portions 91, mounted to pivot supports of mounting bracket 25. Bracket member 90 is biased clockwise as shown in FIGS. 9 and 10, by biasing spring 95 having its ends connected to tongue 94 of the pivoted bracket 90 and tongue 92 of mounting bracket 25.

The pivoted lever 90 further includes a cam follower 88, which rides along peripheral cam surface 84, of the cam member 82, keyed to the VHF input drive shaft 22. Cam member 84 includes a circular region 84 and an inwardly directed lobe portion 86. The location of lobe portion 86 corresponds to the designated UHF or "14th position." Thus, when the VHF tuning section 30 is rotated to any of the designated VHF tuning positions, cam follower 88 will be riding along cam surface 84, and bracket 90 will be moved to its counter-clockwise extreme against the biasing force of spring member 95, as shown in FIG. 9. When the VHF tuning section is moved to the designated UHF position, cam follower 88 circumferentially moves inward into lobe portion 86 of the cam member. Thus, bracket 90 pivots clockwise under the influence of biasing spring 94 to the position shown in FIG. 10.

The pivoted movement of the bracket 90 is translated to longitudinal movement of double faced clutch member 50 via bracket extensions 96 and shifting member 100. Shifting member 100 includes re-entrant portions 98, which cooperatively receive portions 96 of the bracket. Shifting member 100 is thereby longitudinally translatable along the axis of shaft 24, corresponding to the pivotal movement of the bracket 90. With bracket 90 in its counter-clockwise extreme, as shown in FIG. 9, the shifting member 100 is moved to the right. Shifting member 100 in turn includes friction reducing dimples which engage surface 53 of the double faced clutch member 50 for corresponding movement thereof to the right. When bracket member 90 is moved counter-clockwise corresponding to the VHF mode of operation, the outwardly tuned portions 99 of projections 96 engage the opposite surface of the double faced clutch and member 50 and moves it sufficiently to the left, as shown in FIG. 9, to provide engagement of gears 54 and 110.

The intercoupling means and associated VHF and UHF gearing is carried by mounting plate 25, which is secured to VHF and UHF tuning section by screws 29. Mounting plate 25 includes portion 27 for mounting to the television chassis.

VHF FINE TUNING

When the VHF tuning section is in one of the channel 2–13 detented VHF positions, the inter-engagement of the gearing will then be as shown in FIGS. 2, 3, 7 and 9. That is, the double faced clutch member 50 is shifted towards the VHF tuning section 30, such that clutch teeth 52 are in engagement with clutch teeth 57. Prior to any rotational input, by the user at the manual control knob 160, VHF gear carrying plate member 75 will be radially displaced outward, as shown in FIG. 8, under the influence of biasing spring 76. Initially upon a rotational input at control knob 160, the turning of clutch member 56 serves to rotate actuating plate 60, which is slip-clutch coupled thereto by virtue of cup spring washer 58. Depending on the direction of rotation, either of projections 62 and 64 engage portions 63 or 65 of the gear carrying member 75 to radially displace it inward from the position of FIG. 8 to that of FIG. 8A, in the general manner described in aforementioned Delp U.S. Patent No. 3,218,589. This inward movement of plate 75 serves to provide gearing engagement between driven gear teeth 65 and gear member 66 carried thereon, as well as pinion 68 and the gearhead 34 of the individual VHF tuning slug. Upon a further rotational input at manual knob 160, the clutch slips and the rotation of the engaged members 50, 56 and 65 further serves to rotate the VHF fine tuning gear means, comprising the successive gear train 66, 71 and 68 to effect VHF preset fine tuning. Upon a release of the manual control knob 160, the slidable plate 75 is moved radially outwardly under the bias of spring 76, to provide disengagement of gear members 59–66 and 68–34, such that the rotation of the VHF tuning section 30 to another television channel will not disturb the selected fine tuning of the individual slug gear 34.

UHF TUNING

Upon the movement of the VHF tuning section 30 to the designated UHF position, cam follower 88 enters into circumferentially inward lobe portion 86 of the cam member 82, such that double faced clutch member 50 is shifted to provide engagement between clutch teeth 54 and 110. This condition is shown in FIG. 10. Upon a rotational input at manual control knob 160, in either direction, the UHF gearing means is actuated. This gearing means includes the following gear members: gear 108, rotated by drive clutch member 50; peripheral teeth 112 of gear member 108, in engagement with peripheral gear teeth 116 of idler gear 114; pinion 118 carried by gear 114; peripheral teeth 120 of gear member 121 in engagement with pinion 118.

Gear member 120 is keyed to the UHF input drive shaft, which preferably includes a conventional type of planetary gearing arrangement, enclosed within the housing generally indicated by 125.

Figure 1:
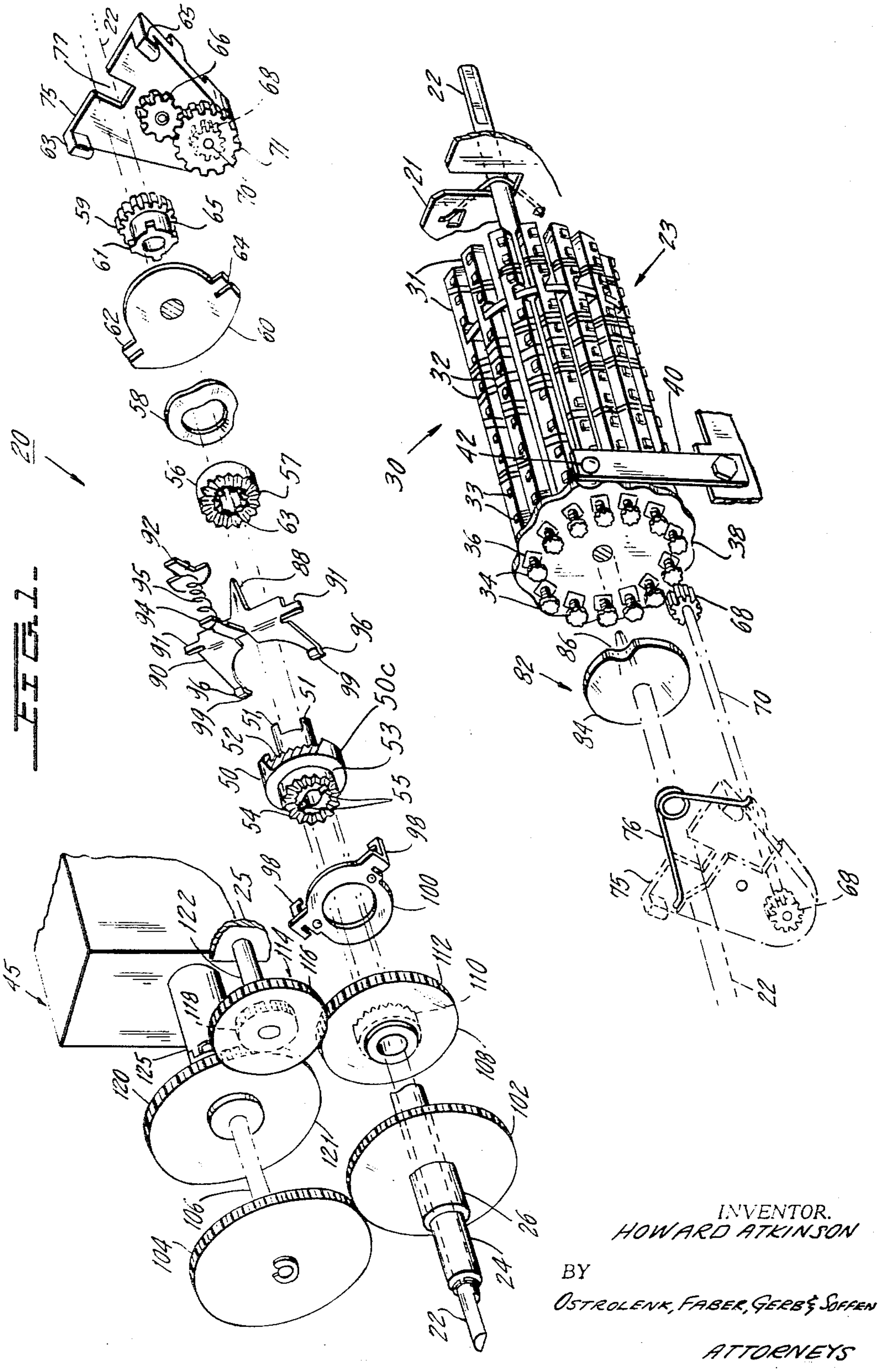
FIG. 1 is an exploded perspective view of an exemplary combination television tuner having an intercoupling means in accordance with the instant invention.
Figure 2:
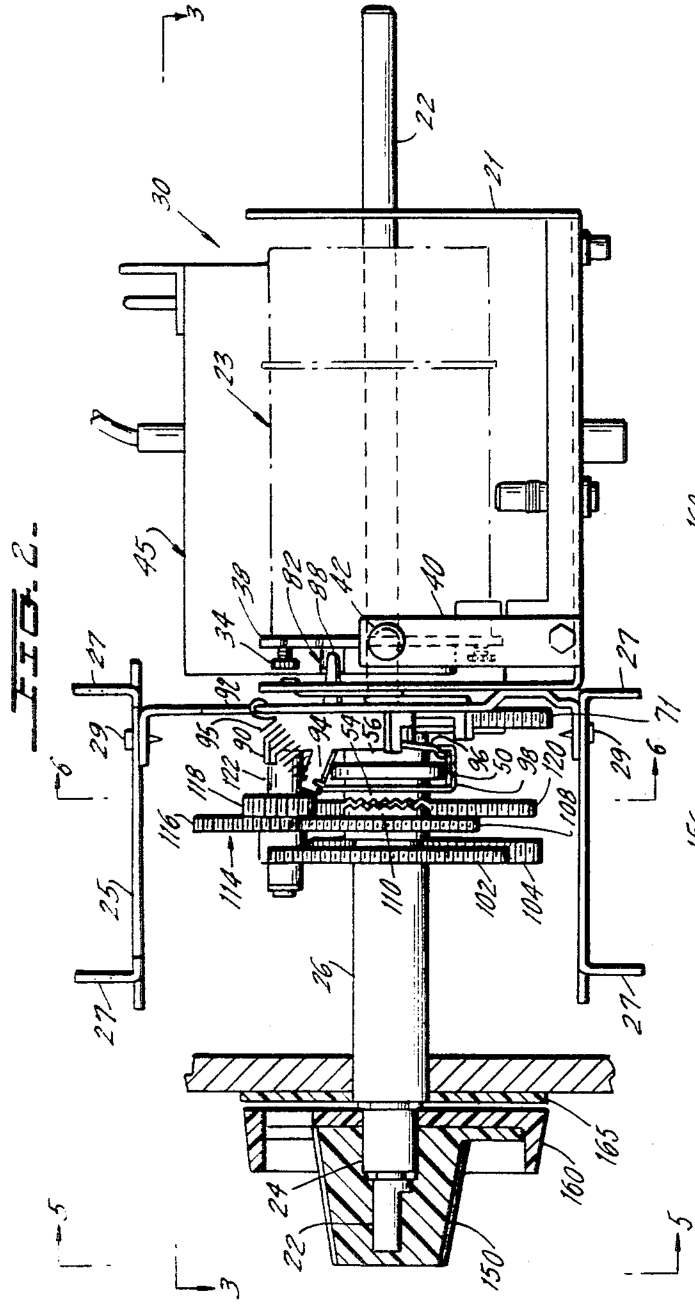
FIG. 2 is a side elevational view of the fully assembled tuner, including manual operating knobs, as located within a television receiver.
Figure 4:
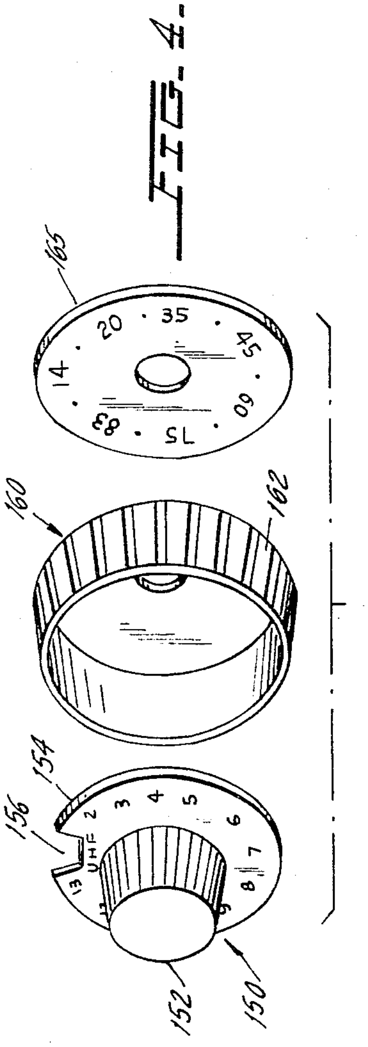
FIG. 4 is an exploded perspective view of a typical manual knob and dial presentation, which may be utilized in conjunction with the instant invention.
Figure 3:
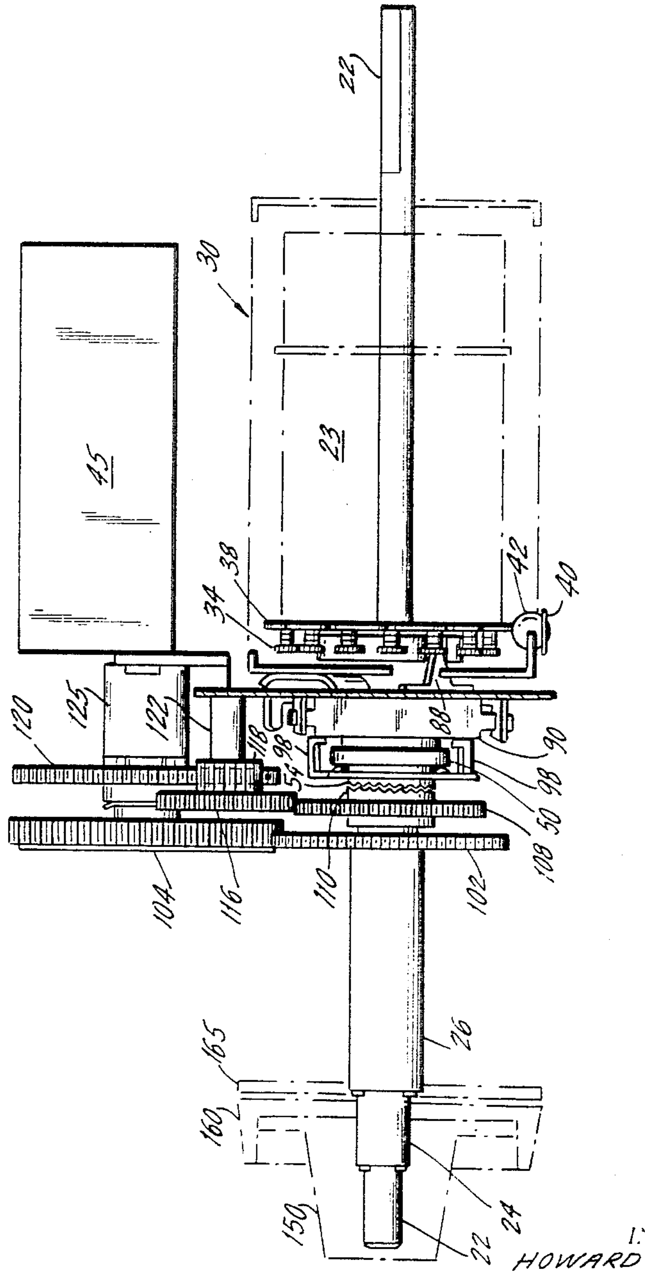
FIG. 3 is a top view of FIG. 2, as indicated by the lines 3—3 of FIG. 2, with the mounting bracket removed.
Figure 6:
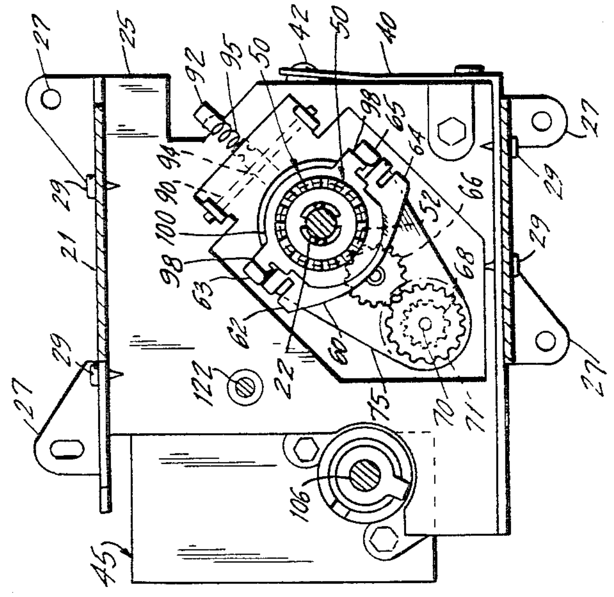
FIG. 6 is a cross-sectional view along the lines 6—6 of FIG. 2, and is provided principally for showing the gearing for VHF fine tuning.
Figure 5:
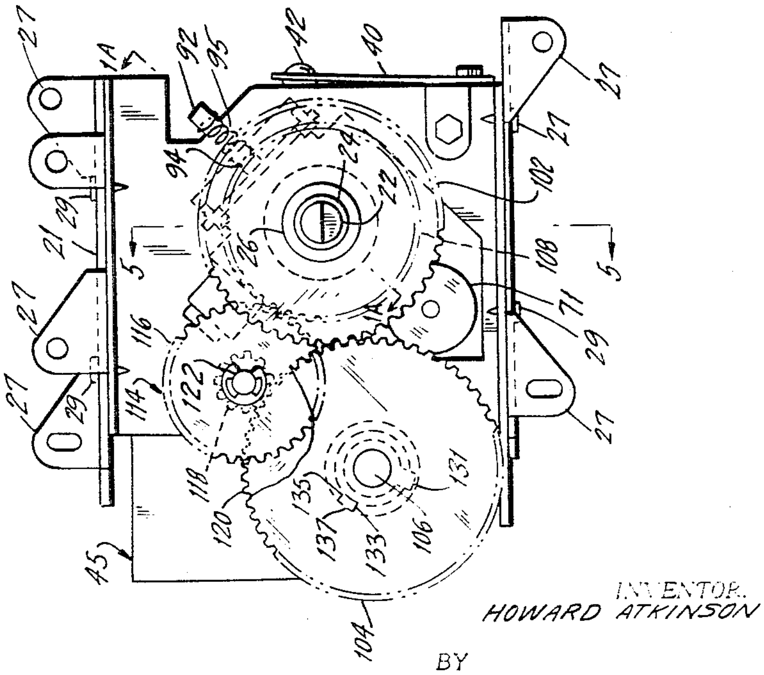
FIG. 5 is a front end view, as indicated by the line 5—5 of FIG. 2, but with the manual control knobs and television cabinetry removed, and is provided particularly for showing the UHF gearing.

The UHF tuner 45 is typically of the continuous type, as shown in aforementioned U.S. patent application Ser. No. 641,654, filed May 26, 1967. In such a UHF tuner, there are arcuate limitations to the permissible extent of UHF drive shaft rotation, with the ends corresponding to the attainment of either channels 14 or 83. Referring to FIG. 5, when the end point is reached, protrusions 131 of the UHF input gearing 125 is rotationally moved during UHF tuning, and engages either edges 133 or 135 of stationary hub member 137. Should the user attempt to further rotate manual input knob 160, some means must be provided to dissipate this rotational movement, so as to prevent stripping of the gears. This is achieved in an extremely simplified manner, as shown in FIG. 11. The engagement of clutch teeth 54 and 110 is maintained by the bias of spring member 94, which urges actuating plate 100 to the left. Since the gear train connected subsequent to gear 108 is prevented from rotation when the arcuate extent of the UHF tuning range is reached, further rotational input of clutch member 50 serves to provide slippage of the clutch teeth 54, 110 against the bias of spring member 94. That is, while clutch member 50 will be rotated by the manual input to the control knob 160, the clutch teeth will be successively disengaged from locked clutch teeth 110, as shown in FIG. 11.

In order to indicate to the user the UHF channel selected, a windowed portion 156 is provided on the VHF tuning knob 150, at the designated UHF position. This window 156 provides a presentation of the rotational position of the UHF indicating dial 165, via a transparent portion of knob 160. UHF indicating dial 165 is keyed to a third coaxial shaft 26, and is driven by gear member 102. Gear member 102 is, in turn, engaged by the peripheral teeth of a gear member 104, keyed to the UHF input drive shaft 106. That is, as a rotational tuning input is provided to the UHF tuner 75, this rotational input serves to simultaneously rotate gear member 104 to provide a visual display of the selected channel.

It is therefore seen that my invention provides an intercoupling arrangement between VHF and UHF tuning sections which substantially simplifies the tuning operation for the user. It is a particularly advantageous aspect thereof that the invention may be employed with respect to conventional commercially available VHF and UHF tuning sections, by virtue of additional gearing means, secured to a bracket member, which may be mounted to the chassis of the VHF and UHF tuning sections in an extremely simple manner.

The embodiments of the invention in which an exclusive privilege or property is claimed are defined as follows.

1. Tuning selection and control means for a combination VHF/UHF television tuner having an incrementally rotatable channel selecting shaft movable to each of a plurality of channel selecting positions, one such position being a UHF tuning position and the remainder being a VHF tuning position, a tuning shaft disposed in relatively rotatable telescoping relation on said channel selecting shaft, and automatic shift mechanism including a first drive element comprising a clutch member keyed to said tuning shaft in axially shiftable relation thereon, said clutch member having first and second sets of clutch teeth at opposite ends thereof and having an annular collar portion projecting radially outwardly of said sets of teeth, second and third drive elements coaxially journalled on said shafts in axially flanking relation to said clutch member to accommodate driving engagement of said clutch member with said second element when said clutch member is shifted in one direction and to accommodate driving engagement of said clutch member with said third element when said clutch member is shifted in the opposite direction, VHF fine tuning gear means coupled to said second element and UHF tuning gear means coupled to said third element and mechanism controlled by rotation of said channel selecting shaft and coupled to said clutch member to engage the same with said VHF fine tuning gear means when said channel selecting shaft is at any of said VHF tuning positions and to engage the same with said UHF tuning gear when said channel selecting shaft is at said UHF tuning position, said mechanism comprising stationary framing having fixed pivot support means, a rigid bracket having pivot structure mounted on said pivot support means to define an axis of pivoting movement transverse to the axis of said channel selecting shaft and spaced radially therefrom, said rigid bracket having an extension portion axially abutting said annular collar portion to impart drive engaging shifting movement to said clutch member in a first axial direction upon pivoting movement of said rigid bracket in a first direction, a shiftable bracket oppositely axially abutting said annular collar portion and having an extension portion engageable by the extension portion of the rigid bracket to impart shifting movement to said clutch member in an opposite axial direction upon pivoting movement of said rigid bracket in an opposite direction, said rigid bracket having a cam follower portion, a cam keyed on said channel selecting shaft and having a generally circular track interrupted by an offset portion that is aligned with said cam follower portion when said channel selecting shaft is at said UHF position, and spring means engageable between said rigid bracket and said stationary framing for urging said cam follower portion against said track.

2. An arrangement in accordance with claim 1 wherein said stationary framing has a pair of pivot support means spaced transversely, wherein said pivot structure of said rigid bracket comprises oppositely directed portions serving as spaced pivot structures mounted on said pivot support means and said extension portion comprises transversely spaced extension parts for abutting spaced regions of said annular collar portion and has a tongue portion serving as said cam follower portion wherein said extension portion of said shiftable bracket has a transversely spaced pair of extension parts engaged with the pair of extension parts of said rigid bracket and wherein said offset portion of the cam is a recess for receiving said tongue.

References Cited

UNITED STATES PATENTS

| | | | |
|---|---|---|---|
| 2,756,599 | 7/1956 | Sperber | 74—10.5 |
| 3,244,012 | 4/1966 | Ma et al. | 74—10.8 |
| 3,270,570 | 9/1966 | Stouffer | 74—10.5 |

MILTON KAUFMAN, Primary Examiner

U.S. Cl. X.R.

74—10.5